United States Patent
Wu et al.

(10) Patent No.: US 12,453,016 B2
(45) Date of Patent: Oct. 21, 2025

(54) ELECTRONIC DEVICE

(71) Applicant: InnoLux Corporation, Miao-Li County (TW)

(72) Inventors: Yuan-Lin Wu, Miao-Li County (TW); Hsiu-Tung Lin, Miao-Li County (TW); Chung-Wen Yen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 210 days.

(21) Appl. No.: 18/474,355

(22) Filed: Sep. 26, 2023

(65) Prior Publication Data
US 2024/0155777 A1    May 9, 2024

(30) Foreign Application Priority Data
Nov. 7, 2022 (CN) .......................... 202211385983.6

(51) Int. Cl.
*H05K 3/46* (2006.01)
*H05K 1/03* (2006.01)
*H05K 3/38* (2006.01)
*H05K 3/42* (2006.01)

(52) U.S. Cl.
CPC ......... *H05K 3/4688* (2013.01); *H05K 1/0306* (2013.01); *H05K 3/386* (2013.01); *H05K 3/42* (2013.01); *H05K 2201/09045* (2013.01); *H05K 2201/20* (2013.01)

(58) Field of Classification Search
CPC .... H05K 3/4688; H05K 1/0306; H05K 3/386; H05K 2201/09063
See application file for complete search history.

(56) References Cited

U.S. PATENT DOCUMENTS

| | | | |
|---|---|---|---|
| 11,189,668 B2 | 11/2021 | Park et al. | |
| 2022/0037619 A1 | 2/2022 | Chang et al. | |
| 2022/0083170 A1* | 3/2022 | Liu | G06F 3/0412 |

FOREIGN PATENT DOCUMENTS

| | | |
|---|---|---|
| TW | 201937665 A | 9/2019 |
| TW | 202021060 A | 6/2020 |

OTHER PUBLICATIONS

TW Office Action dated Jun. 3, 2025 in Taiwan application No. 112109952.

* cited by examiner

*Primary Examiner* — Sherman Ng
(74) *Attorney, Agent, or Firm* — McClure, Qualey & Rodack, LLP

(57) ABSTRACT

An electronic device is provided. The electronic device includes a first insulating layer, a second insulating layer, an adhesive layer, and a functional layer. The first insulating layer has a side surface and at least one recess adjacent to the side surface. The second insulating layer is disposed on the first insulating layer and filled in the at least one recess. The adhesive layer is disposed on the second insulating layer. The functional layer is disposed on the adhesive layer. In addition, in a cross-sectional view of the electronic device, the second insulating layer has a thickness at a first position, and a thickness of the adhesive layer corresponding to the first position is greater than the thickness of the second insulating layer.

20 Claims, 8 Drawing Sheets

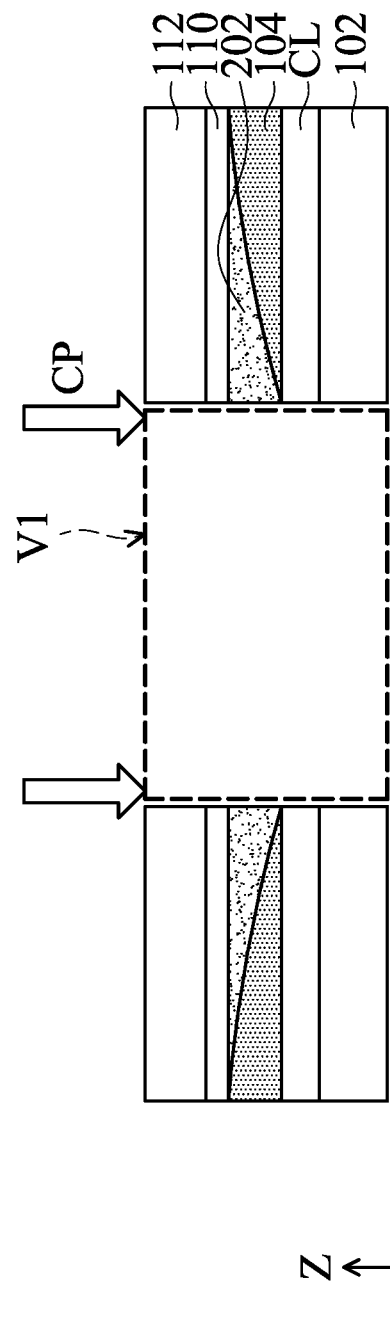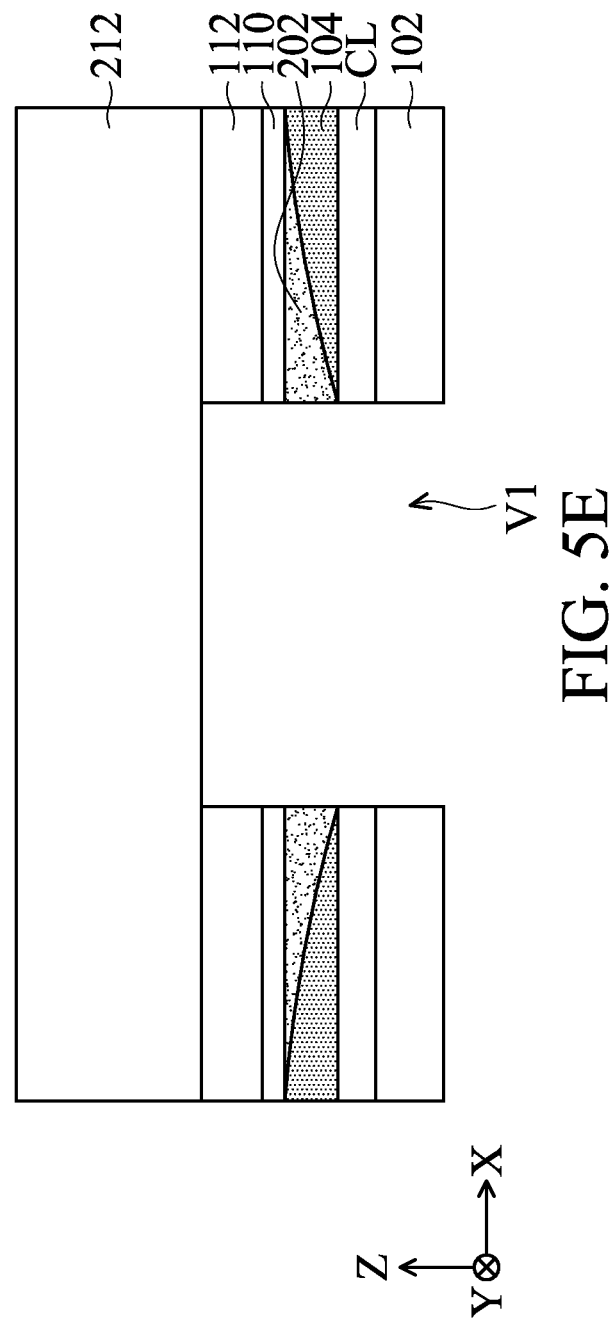

ELECTRONIC DEVICE

CROSS REFERENCE TO RELATED APPLICATIONS

This application claims the benefit of China Application No. 202211385983.6, filed Nov. 7, 2022, the entirety of which is incorporated by reference herein.

BACKGROUND

Technical Field

The present disclosure is related to an electronic device, and in particular it is related to a design for an insulating layer structure of an edge area or an area around the through-hole of an electronic device.

Description of the Related Art

Electronic products, such as tablet computers, notebook computers, smartphones, displays and televisions, have become an indispensable necessity in modern society. With the rapid development of these portable electronic devices, consumers have high expectations regarding their quality, functionality, or price.

However, these electronic devices still do not meet the high expectations placed upon them in all respects. For example, there are problems with poor adhesion of multi-layer structures, or water and oxygen infiltration in the edge areas of a substrate, or the area around through-holes (when the substrate has a through-hole) in such electronic devices. How to further improve the reliability of electronic devices is still one of the current research topics in the industry.

SUMMARY

In accordance with some embodiments of the present disclosure, an electronic device is provided. The electronic device includes a first insulating layer, a second insulating layer, an adhesive layer, and a functional layer. The first insulating layer has a side surface and at least one recess adjacent to the side surface. The second insulating layer is disposed on the first insulating layer and filled in the at least one recess. The adhesive layer is disposed on the second insulating layer. The functional layer is disposed on the adhesive layer. In addition, in a cross-sectional view of the electronic device, the second insulating layer has a thickness at a first position, and a thickness of the adhesive layer corresponding to the first position is greater than the thickness of the second insulating layer.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein:

FIG. 5A to FIG. 5E are schematic structural diagrams of an electronic device during the manufacturing process in accordance with some embodiments of the present disclosure.

DETAILED DESCRIPTION

Figure 1A:
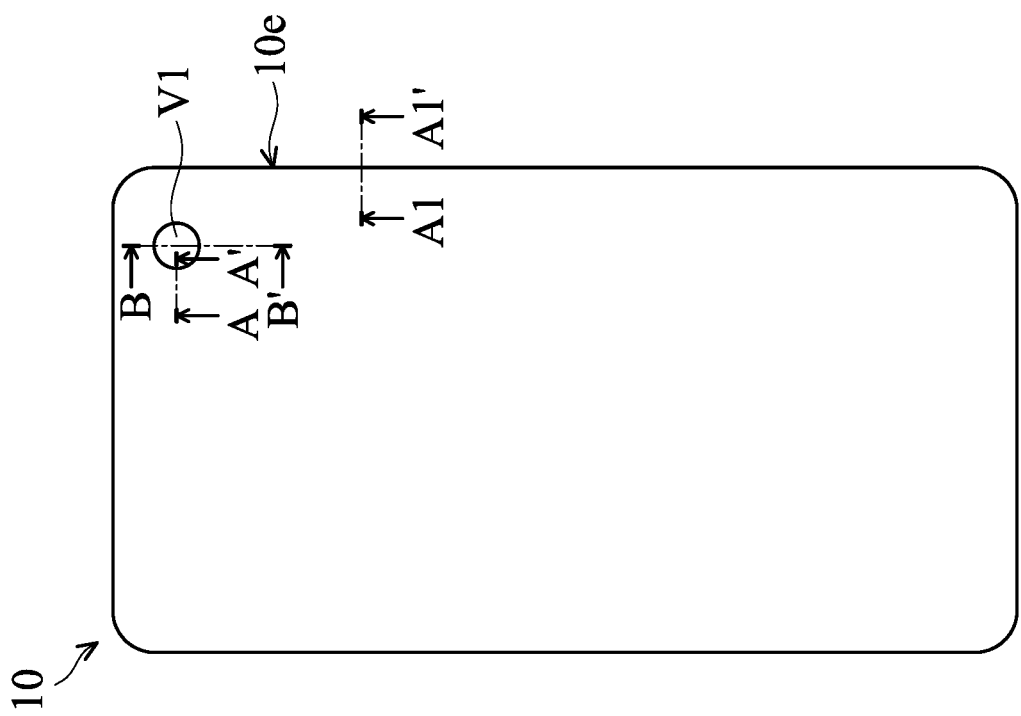
FIG. 1A is a top-view diagram of an electronic device in accordance with some embodiments of the present disclosure.

The electronic devices according to the present disclosure are described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. These embodiments are used merely for the purpose of illustration, and the present disclosure is not limited thereto. In addition, different embodiments may use like and/or corresponding numerals to denote like and/or corresponding elements in order to clearly describe the present disclosure. However, the use of like and/or corresponding numerals of different embodiments does not suggest any correlation between different embodiments.

It should be understood that relative expressions may be used in the embodiments. For example, "lower", "bottom", "higher" or "top" are used to describe the position of one element relative to another. It should be appreciated that if a device is flipped upside down, an element that is "lower" will become an element that is "higher". The present disclosure can be understood by referring to the following detailed description in connection with the accompanying drawings. The drawings are also regarded as part of the description of the present disclosure. It should be understood that the drawings of the present disclosure may be not drawn to scale. In fact, the size of the elements may be arbitrarily enlarged or reduced to clearly represent the features of the present disclosure.

Furthermore, the expression "a first material layer is disposed on or over a second material layer" may indicate that the first material layer is in direct contact with the second material layer, or it may indicate that the first material layer is in indirect contact with the second material layer. In the situation where the first material layer is in indirect contact with the second material layer, there may be one or more intermediate layers between the first material layer and the second material layer. However, the expression "the first material layer is directly disposed on or over the second material layer" means that the first material layer is in direct contact with the second material layer, and there is no intermediate element or layer between the first material layer and the second material layer.

Moreover, it should be understood that the ordinal numbers used in the specification and claims, such as the terms "first", "second", etc., are used to modify an element, which itself does not mean and represent that the element (or elements) has any previous ordinal number, and does not mean the order of a certain element and another element, or the order in the manufacturing method. The use of these ordinal numbers is to make an element with a certain name can be clearly distinguished from another element with the same name. Claims and the specification may not use the same terms. For example, the first element in the specification may refer to the second element in the claims.

In accordance with the embodiments of the present disclosure, regarding the terms such as "connected to", "interconnected with", etc. referring to bonding and connection, unless specifically defined, these terms mean that two structures are in direct contact or two structures are not in direct contact, and other structures are provided to be disposed between the two structures. The terms for bonding and connecting may also include the case where both structures are movable or both structures are fixed. In addition, the term "electrically connected to" or "coupled to" may include any direct or indirect electrical connection means.

In the following descriptions, terms "about" and "substantially" typically mean +/−10% of the stated value, or typically +/−5% of the stated value, or typically +/−3% of the stated value, or typically +/−2% of the stated value, or typically +/−1% of the stated value or typically +/−0.5% of the stated value. The expression "in a range from the first value to the second value" or "between the first value and the second value" means that the range includes the first value, the second value, and other values in between.

It should be understood that in the following embodiments, without departing from the spirit of the present disclosure, the features in several different embodiments can be replaced, recombined, and mixed to complete another embodiment. The features between the various embodiments can be mixed and matched arbitrarily as long as they do not violate or conflict the spirit of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with the embodiments of the present disclosure, an electronic device is provided, which includes a multilayer insulating layer structure. For example, the second insulating layer is filled in the recess of the first insulating layer, the adhesive layer is covered on the second insulating layer, and the thickness of the adhesive layer is greater than the thickness of the second insulating layer. This configuration can reduce the problems of uneven thickness of the film layers or peeling of the film layers caused by the adsorption of water and oxygen in the edge area of the substrate or the area around the through-hole of the substrate. Therefore, the adhesion between the insulating layer structure and the upper functional layer can be improved, or the overall reliability of the electronic device can be improved.

In accordance with the embodiments of the present disclosure, the electronic device may include a display device, an antenna device, a light-emitting device, a sensing device, a tiled device, a touch sensing electronic device, a curved electronic device or a non-rectangular electronic device, but it is not limited thereto. The electronic device may, for example, include liquid crystal, light-emitting diode, quantum dot (QD), fluorescence, phosphor, another suitable display medium, or a combination thereof, but it is not limited thereto. The display device may be a non-self-luminous display device or a self-luminous display device. The electronic device may include electronic components. The electronic components may include passive components and active components, such as capacitors, resistors, inductors, diodes, transistors, and the like. The diode may include a light-emitting diode (LED) or a photodiode. The light-emitting diode may include organic light-emitting diode (OLED), mini light-emitting diode (mini LED), micro-light-emitting diodes (micro LED) or quantum dot light-emitting diode (quantum dot LED), but it is not limited thereto. The antenna device may be a liquid-crystal type antenna device or a non-liquid crystal type antenna device. The sensing device may be a sensing device for sensing capacitance, light, thermal energy or ultrasonic waves, but it is not limited thereto. The tiled device may be, for example, a display tiled device or an antenna tiled device, but it is not limited thereto. It should be noted that the electronic device may be any permutation and combination of the aforementioned, but the present disclosure is not limited thereto. In addition, the electronic device may be a bendable or flexible electronic device. In addition, the shape of the electronic device may be rectangular, circular, polygonal, with curved edges, or other suitable shapes. The electronic device may have peripheral systems such as a driving system, a control system, a light source system, etc. to support a display device, an antenna device, a wearable device (e.g., including an augmented reality (AR) device or a virtual reality (VR) device), a vehicle-mounted device (e.g., including a car windshield), or a tiled device. For the convenience of description, the electronic device will be described below as a display device, but the present disclosure is not limited thereto.

Figure 1B:
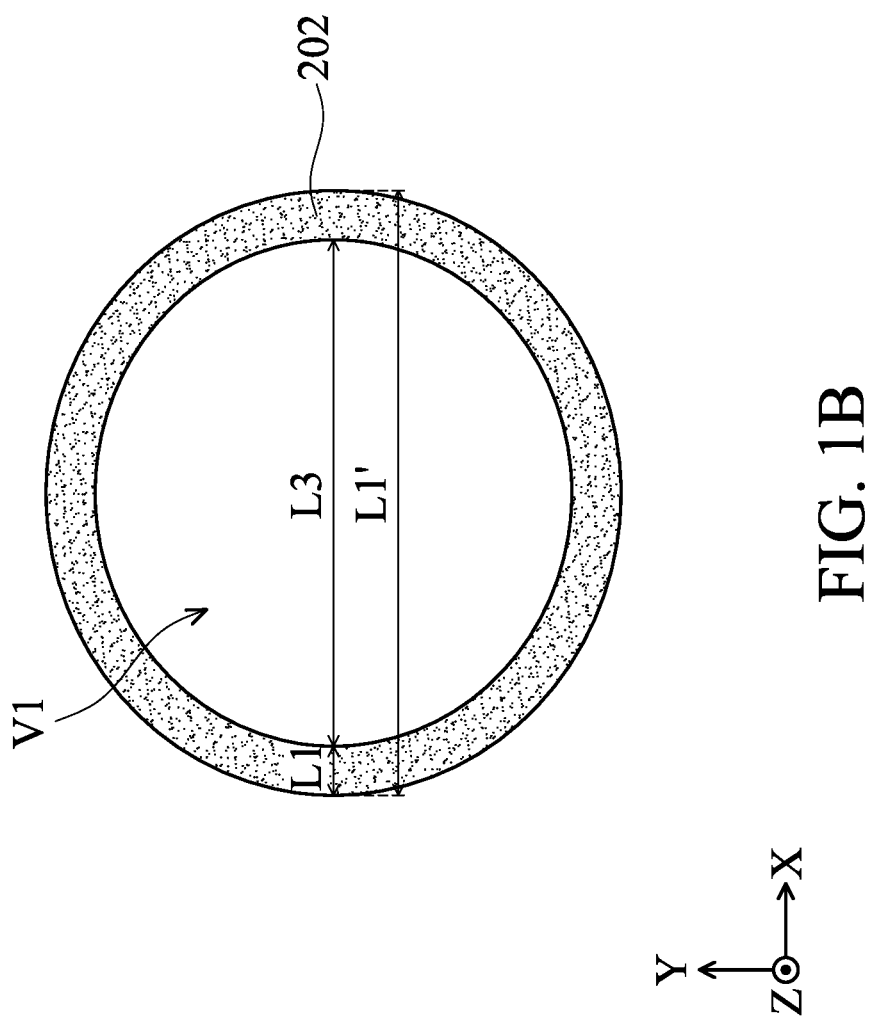
FIG. 1B is a partial top-view diagram of an electronic device in accordance with some embodiments of the present disclosure.
Figure 2A:
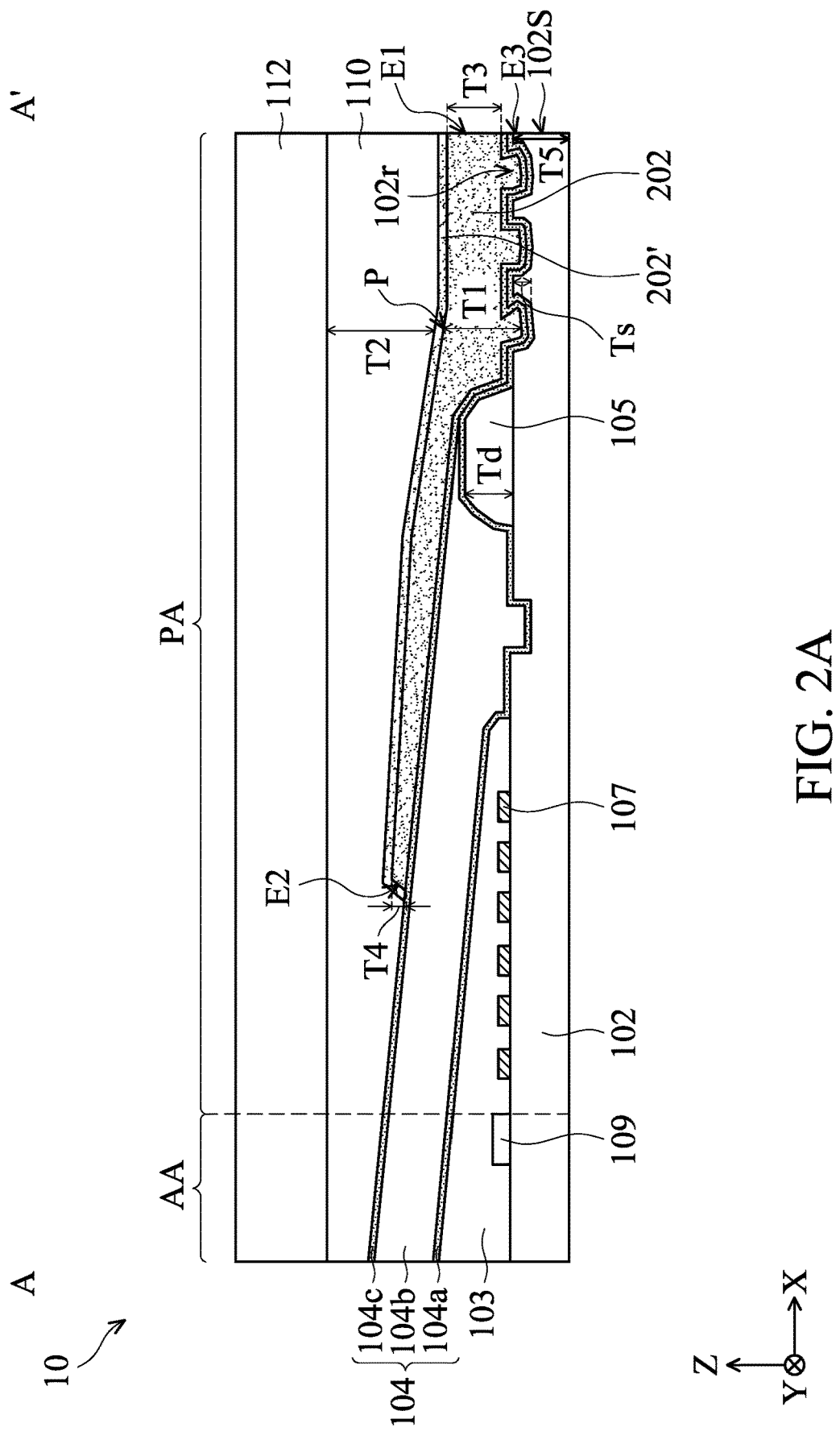
FIG. 2A is a partial cross-sectional diagram of an electronic device corresponding to the section line A-A' of FIG. 1A in accordance with some embodiments of the present disclosure.

Please refer to FIG. 1A, FIG. 1B and FIG. 2A. FIG. 1A is a top-view diagram of an electronic device 10 in accordance with some embodiments of the present disclosure. FIG. 1B is a partial top-view diagram of the electronic device 10 in accordance with some embodiments of the present disclosure. FIG. 2A is a partial cross-sectional diagram of the electronic device 10 corresponding to the section line A-A' of FIG. 1A in accordance with some embodiments of the present disclosure. It should be understood that, according to some embodiments, the structure shown in FIG. 2A can also be a cross-sectional diagram of the electronic device 10 corresponding to the section line A1-A1' of FIG. 1A. In other words, the structure shown in FIG. 2A can correspond to the area around the through-hole V1 of the electronic device 10 or the area of the edge 10e of the electronic device 10. In addition, it should be understood that, for clarity, some elements of the electronic device 10 are omitted in the drawings, and only some elements are schematically shown. FIG. 1A and FIG. 1B show only some of the components in FIG. 2A. Furthermore, according to some embodiments, additional features may be added to the electronic device 10 described below.

As shown in FIG. 1A, FIG. 1B and FIG. 2A, in accordance with some embodiments, the electronic device 10 may have a first insulating layer 102, a second insulating layer 202, an adhesive layer 110 and a first functional layer 112.

The first insulating layer 102 may have a side surface 102S and at least one recess 102r adjacent to the side surface 102S. The recess 102r may be disposed on the upper surface of the first insulating layer 102, and the side surface 102S may be the side surface of the first insulating layer 102 closest to the through-hole V1 or the edge 10e of the electronic device 10. In accordance with some embodiments, the first insulating layer 102 may have a plurality of recesses 102r adjacent to the side surface 102S.

In accordance with some embodiments, the first insulating layer 102 may serve as a part of the substrate structure. In some embodiments, if the substrate structure has a multi-layer structure, the first insulating layer 102 may be the uppermost layer of the multi-layer structure, but the present disclosure is not limited thereto. In accordance with some embodiments, the material of the first insulating layer 102 may include polyimide (PI), polycarbonate (PC), polyethylene terephthalate (PET), polypropylene (PP), glass, quartz, sapphire, ceramic, another suitable insulating material or a combination thereof, but it is not limited thereto.

In accordance with some embodiments, the electronic device 10 may further include a circuit component 107 and an electronic component 109, and the circuit component 107 and the electronic component 109 may be disposed on the first insulating layer 102. The electronic device 10 may have an active area AA and a peripheral area PA adjacent to the active area AA. In accordance with some embodiments, the area between the electronic component 109 closest to the side surface 102S of the first insulating layer 102 and the side surface 102S may be defined as the peripheral area PA of the electronic device 10, and the area inward from the electronic component 109 can be defined as the active area AA. In accordance with some embodiments, the active area AA may surround the peripheral area PA, and the peripheral area PA may surround the through-hole V1. In accordance with some other embodiments, the peripheral area PA may surround the active area AA, and the peripheral area PA may be located between the active area AA and the edge 10e of the electronic device 10.

In accordance with some embodiments, the circuit component 107 may be, for example, a metal wire to transmit a signal, e.g., a signal of a touch sensing function, but it is not limited thereto. In accordance with some embodiments, the material of the circuit component 107 may include copper (Cu), aluminum (Al), molybdenum (Mo), tungsten (W), gold (Au), silver (Ag), tin (Sn), chromium (Cr), nickel (Ni), platinum (Pt), titanium (Ti), iridium (Ir), rhodium (Rh), alloys of the aforementioned metals, another suitable conductive material, or a combination thereof, but it is not limited thereto.

In accordance with some embodiments, the electronic component 109 may include a light-emitting element, a switching element or a photodiode, but it is not limited thereto. The switching element may include, for example, a thin-film transistor, but it is not limited thereto.

In accordance with some embodiments, the electronic device 10 may further include an insulating layer 103, an insulating layer 104, and a protrusion structure 105. The insulating layer 103 may be disposed on the first insulating layer 102 and cover the circuit component 107 and the electronic component 109. The insulating layer 104 may be disposed on the first insulating layer 102 and the insulating layer 103. The protrusion structure 105 may be disposed on the first insulating layer 102, and a portion of the insulating layer 104 may be disposed on the protrusion structure 105. In accordance with some embodiments, the protrusion structure 105 may be disposed between the first insulating layer 102 and the second insulating layer 202. In addition, in the normal direction of the first insulating layer 102 (for example, the normal direction of the top surface of the first insulating layer 102, i.e. the Z direction in the drawing), the protrusion structure 105 does not overlap with the recess 102r.

In accordance with some embodiments, the insulating layer 103 may be a part of a planarization layer in the active area AA. In accordance with some embodiments, the material of the insulating layer 103 may include an organic material, an inorganic material, another suitable material or a combination thereof, but it is not limited thereto. In accordance with some embodiments, the organic material may include epoxy resin, silicone resin, acrylic resin (such as polymethylmethacrylate, PMMA), polyimide, perfluoroalkoxy alkane (PFA), another suitable material, or a combination thereof, but it is not limited thereto. In accordance with some embodiments, the inorganic material may include silicon nitride, silicon oxide, silicon oxynitride, aluminum oxide, another suitable material or a combination thereof, but it is not limited thereto.

In accordance with some embodiments, the insulating layer 104 may have a single-layer or multi-layer structure and may be an encapsulation structure to reduce the problem of water and oxygen invasion. In one embodiment, when the insulating layer 104 has a multilayer structure, for example, the insulating layer 104 may include an inorganic layer 104a, an organic layer 104b, and an inorganic layer 104c, and the organic layer 104b may be disposed between the inorganic layer 104a and the inorganic layer 104c, but the present disclosure is not limited thereto. In accordance with some embodiments, the inorganic layer 104a and the inorganic layer 104c may be conformally disposed in a part of the recess 102r of the first insulating layer 102 and extend to adjacent to the side surface 102S of the first insulating layer 102. In accordance with some embodiments, the thickness of the organic layer 104b may be decreased toward the direction of the side surface 102S. In accordance with some embodiments, the inorganic materials of the inorganic layer 104a and the inorganic layer 104c may be the same as or similar to that mentioned above, and will not be repeated here. Moreover, the material of the inorganic layer 104a and the material of the inorganic layer 104c may be the same or different, and the present disclosure is not limited thereto. In accordance with some embodiments, the organic material of the organic layer 104b may be the same as or similar to that as mentioned above, and will not be repeated here.

In accordance with some embodiments, the organic layer 104b may be disposed between the first insulating layer 102 and the second insulating layer 202. In addition, in the normal direction of the first insulating layer 102 (for example, the Z direction in the drawing), the organic layer 104b overlaps with at least a portion of the protrusion structure 105, but it does not overlap with the recess 102r. In accordance with some embodiments, the organic layer 104b may be blocked by the protrusion structure 105 and not extend to the recess 102r to adjacent to the side surface 102S of the first insulating layer 102. In accordance with some embodiments, the material of the protrusion structure 105 may include an organic material, and the organic material may be the same as or similar to that mentioned above, and will not be repeated here.

Moreover, the second insulating layer 202 may be disposed on the first insulating layer 102 and filled in at least one recess 102r. Specifically, at least part of the recess 102r may be filled by the second insulating layer 202. In other words, as long as there is a second insulating layer 202 in at least one recess 102r, the second insulating layer 202 does not necessarily need to exist in the entire recess 102r. It should be noted that if the second insulating layer 202 does not fill into at least one recess 102r of the first insulating layer 102, a gap may form between the recess 102r and the adhesive layer 110 above the second insulating layer 202. This causes the adhesive layer 110 to be easily separated from the underlying structure. In accordance with some embodiments, the material of the second insulating layer 202 may include an organic material, and the organic material may be the same as or similar to that mentioned above, and will not be repeated here.

In addition, in accordance with some embodiments, the electronic device 10 may further include an inorganic layer 202'. The inorganic layer 202' may be disposed on the second insulating layer 202, and the second insulating layer 202 may be disposed between the inorganic layer 202' and the insulating layer 104. In one embodiment, the second insulating layer 202 may be disposed between the inorganic layer 202' and the inorganic layer 104c. It should be noted that the second insulating layer 202 containing organic materials can have better filling and leveling effect, while the inorganic layer 202' and the adjacent inorganic layer 104c have similar surface properties due to the inorganic materials, so the uniformity of adhesion with the upper structure (such as the adhesive layer 110) can be improved. In accordance with some embodiments, the material of the inorganic layer 202' may be the same as or similar to that mentioned above, and will not be repeated here.

As described above, the adhesive layer 110 may be disposed on the second insulating layer 202. In accordance with some embodiments, the adhesive layer 110 may be disposed on the inorganic layer 104c of the insulating layer 104 and the inorganic layer 202'. The adhesive layer 110 may be any suitable adhesive. For example, in accordance with some embodiments, the adhesive layer 110 may include a light-curable adhesive, a heat-curable adhesive, a light-heat curable adhesive, another suitable material, or a combination thereof, but it is not limited thereto. For example, the adhesive layer 110 may include optical clear adhesive (OCA), optical clear resin (OCR), pressure sensitive adhesive (PSA), another suitable adhesive material, or a combination thereof, but it is not limited thereto.

Furthermore, a first functional layer 112 may be disposed on the adhesive layer 110. The adhesive layer 110 can bond the first functional layer 112 to the structure below. For example, the adhesive layer 110 may bond the first functional layer 112 to the second insulating layer 202 and the insulating layer 104. In accordance with some embodiments, the first functional layer 112 may have a multi-layer structure, for example, may include an anti-reflection layer. In accordance with some embodiments, the anti-reflection layer may include a polarizer, a color filter layer, another suitable anti-reflection layer, or a combination thereof, but it is not limited thereto. In accordance with some embodiments, the color filter layer may include a green color filter layer, but it is not limited thereto.

Please refer to FIG. 2A, in a cross-sectional view of the electronic device 10, the second insulating layer 202 has a thickness T1 at the first position P, and a thickness T2 of the adhesive layer 110 corresponding to the first position P is greater than the thickness T1 of the second insulating layer 202. In accordance with some embodiments, the first position P may be any position where both the second insulating layer 202 and the adhesive layer 110 are present in the cross-sectional view. In accordance with some embodiments, the second insulating layer 202 may have a maximum thickness at the first position P (as shown in the drawing). Specifically, in accordance with some embodiments, the thickness T1 of the second insulating layer 202 may be between 8 micrometers (μm) and 12 micrometers (μm) (i.e. 8 μm≤thickness T1≤12 μm), such as 9 μm, 10 μm or 11 μm, but it is not limited thereto. In accordance with some embodiments, the thickness T2 of the adhesive layer 110 may be between 20 μm and 40 μm (i.e. 20 μm≤thickness T2≤40 μm), such as 25 μm, 30 μm or 35 μm, but it is not limited thereto.

Furthermore, the aforementioned thickness T1 of the second insulating layer 202 refers to the thickness of the second insulating layer 202 in the normal direction of the first insulating layer 102 (for example, the Z direction in the drawing). The thickness T2 of the adhesive layer 110 refers to the thickness of the adhesive layer 110 in the normal direction of the adhesive layer 110 (for example, the Z direction in the drawing).

It should be understood that, in accordance with the embodiments of the present disclosure, an optical microscope (OM), a scanning electron microscope (SEM), a film thickness profiler (α-step), an ellipsometer or another suitable method can be used to measure the thickness, length, or width of an element, or the distance, spacing or angle between elements. Specifically, in accordance with some embodiments, a scanning electron microscope can be used to obtain a cross-sectional image including the element to be measured, and the thickness, length, or width of an element, or the distance, spacing or angle between elements in the image can be measured.

It should be noted that the second insulating layer 202 can provide a relatively flat bonding surface for the adhesive layer 110, so that gaps are not easily generated between the second insulating layer 202 and the adhesive layer 110, and the adhesion between them can be improved. The overall reliability of electronic device therefore can be improved. However, if the thickness T1 of the second insulating layer 202 is too large (for example, greater than the thickness T2 of the adhesive layer 110), it may absorb too much moisture and increase the peeling phenomenon. If the thickness T1 of the second insulating layer 202 is too small, then the effect of preventing water and oxygen invasion may be poor (for example, water or oxygen may invade into the electronic device, thereby affecting the performance of electronic components such as thin-film transistors or OLEDs).

In addition, in accordance with some embodiments, a ratio of the thickness T2 of the adhesive layer 110 to the thickness T1 of the second insulating layer 202 at the first position P may be greater than 1 and less than or equal to 5 (i.e. 1<T2/T1≤5). In accordance with some embodiments, the ratio of the thickness T2 of the adhesive layer 110 to the thickness T1 of the second insulating layer 202 may be greater than or equal to 2 and less than or equal to 3 (i.e. 2≤T2/T1≤3). It should be noted that, when the ratio of the thickness T2 of the adhesive layer 110 to the thickness T1 of the second insulating layer 202 conforms to a specific range (for example, 1<T2/T1≤5), there is better adhesion and/or better attachment between the second insulating layer 202 and the adhesive layer 110. Specifically, if the ratio of the thickness T2 to the thickness T1 is too small (for example, less than 1), the second insulating layer 202 may absorb too much moisture and increase the peeling phenomenon; on the contrary, if the ratio of the thickness T2 to the thickness T1 is too large (for example, greater than 5), it may cause the adhesion between the adhesive layer 110 and the upper and lower layers to decrease.

In a cross-sectional view of the electronic device 10, the second insulating layer 202 has a first end E1 adjacent to the side surface 102S and a second end E2 away from the side surface 102S. The first end E1 has a thickness T3, and the second end E2 has a thickness T4. Furthermore, the first insulating layer 102 has a third end E3 adjacent to the side surface 102S, and the third end E3 has a thickness T5. In accordance with some embodiments, a ratio of the thickness T4 of the second end E2 to the thickness T3 of the first end E1 may be greater than or equal to 0.8 and less than or equal to 1.2 (i.e. $0.8 \le T4/T3 \le 1.2$). For example, the ratio of the thickness T4 to the thickness T3 may be 0.9, 1.0 or 1.1, but it is not limited thereto. In addition, in accordance with some embodiments, a ratio of the thickness T5 of the third end E3 of the first insulating layer 102 to the thickness T3 of the first end E1 of the second insulating layer 202 may be greater than or equal to 0.8 and less than or equal to 1.2 (i.e. $0.8 \le T5/T3 \le 1.2$). For example, the ratio of the thickness T5 to the thickness T3 may be 0.9, 1.0 or 1.1, but it is not limited thereto.

In accordance with some embodiments, the first end E1 is an end of the second insulating layer 202 close to the through-hole V1 or the edge 10e of the electronic device 10, and the second end E2 is an end of the second insulating layer 202 away from the through-hole V1 or the edge 10e of the electronic device 10 (which can also be considered as an end closer to the active area AA). Furthermore, the third end E3 is an end of the first insulating layer 102 close to the through-hole V1 or the edge 10e of the electronic device 10. As described above, the aforementioned thickness T3 and thickness T4 of the second insulating layer 202 refer to the thickness of the second insulating layer 202 in the Z direction. The aforementioned thickness T5 of the first insulating layer 102 refers to the thickness of the first insulating layer 102 in the Z direction.

It should be noted that when the ratio of the thickness T3 of the first end E1 to the thickness T4 of the second end E2 of the second insulating layer 202 conforms to a specific range (for example, $0.8 \le T4/T3 \le 1.2$), the thickness of the second insulating layer 202 is relatively uniform, which can reduce the peeling off phenomenon resulting from the second insulating layer 202 absorbs too much water and oxygen near the through-hole V1 or the edge 10e of the electronic device 10. In addition, when the ratio of the thickness T3 of the first end E1 of the second insulating layer 202 to the thickness T5 of the third end E3 of the first insulating layer 102 conforms to a specific range (for example, $0.8 \le T5/T3 \le 1.2$), the second insulating layer 202 is also not easy to absorb too much water and oxygen, which can reduce the phenomenon of peeling off.

Moreover, in accordance with some embodiments, in the cross-sectional view of the electronic device 10, the protrusion structure 105 has a thickness Td, and a ratio of the thickness Td of the protrusion structure 105 to the thickness T3 of the first end E1 of the second insulating layer 202 may be greater than or equal to 0.8 and less than or equal to 1.2 (i.e. $0.8 \le Td/T3 \le 1.2$). For example, the ratio of the thickness Td to the thickness T3 may be 0.9, 1.0 or 1.1, but it is not limited thereto. Specifically, in accordance with some embodiments, the thickness Td of the protrusion structure 105 may be between 3 μm and 6 μm (i.e. 3 μm≤thickness Td≤6 μm), such as 4 μm or 5 μm, but it is not limited thereto. The aforementioned thickness Td of the protrusion structure 105 refers to the maximum thickness of the protrusion structure 105 in the Z direction.

It should be noted that when the thickness of the second insulating layer 202 at the first end E1 (close to the through-hole V1 or the edge 10e of the electronic device 10) is similar to the thickness of the protrusion structure 105 (for example, when $0.8 \le Td/T3 \le 1.2$), a relatively flat bonding surface of the adhesive layer 110 can be provided, so that the overall structural strength of the electronic device can be improved and/or the phenomenon of separation of film layers can be reduced.

In accordance with some embodiments, in the cross-sectional view of the electronic device 10, the recess 102r has a depth Ts, and the thickness T3 of the first end E1 of the second insulating layer 202 may be greater than the depth Ts of the recess 102r and smaller than the thickness Td of the protrusion structure 105 (i.e. Ts<T3<Td). The aforementioned depth Ts of the recess 102r refers to the maximum depth of the recess 102r in the Z direction.

It should be noted that when the thickness of the second insulating layer 202 at the first end E1 (near the through-hole V1 or the edge 10e of the electronic device 10), the thickness Td of the protrusion structure 105 and the depth Ts of the recess 102r conform to the aforementioned specific relationship (i.e. Ts<T3<Td), the second insulating layer 202 has a better filling effect and is less likely to absorb too much moisture or oxygen, thereby improving the overall structural strength of the electronic device.

Figure 2B:
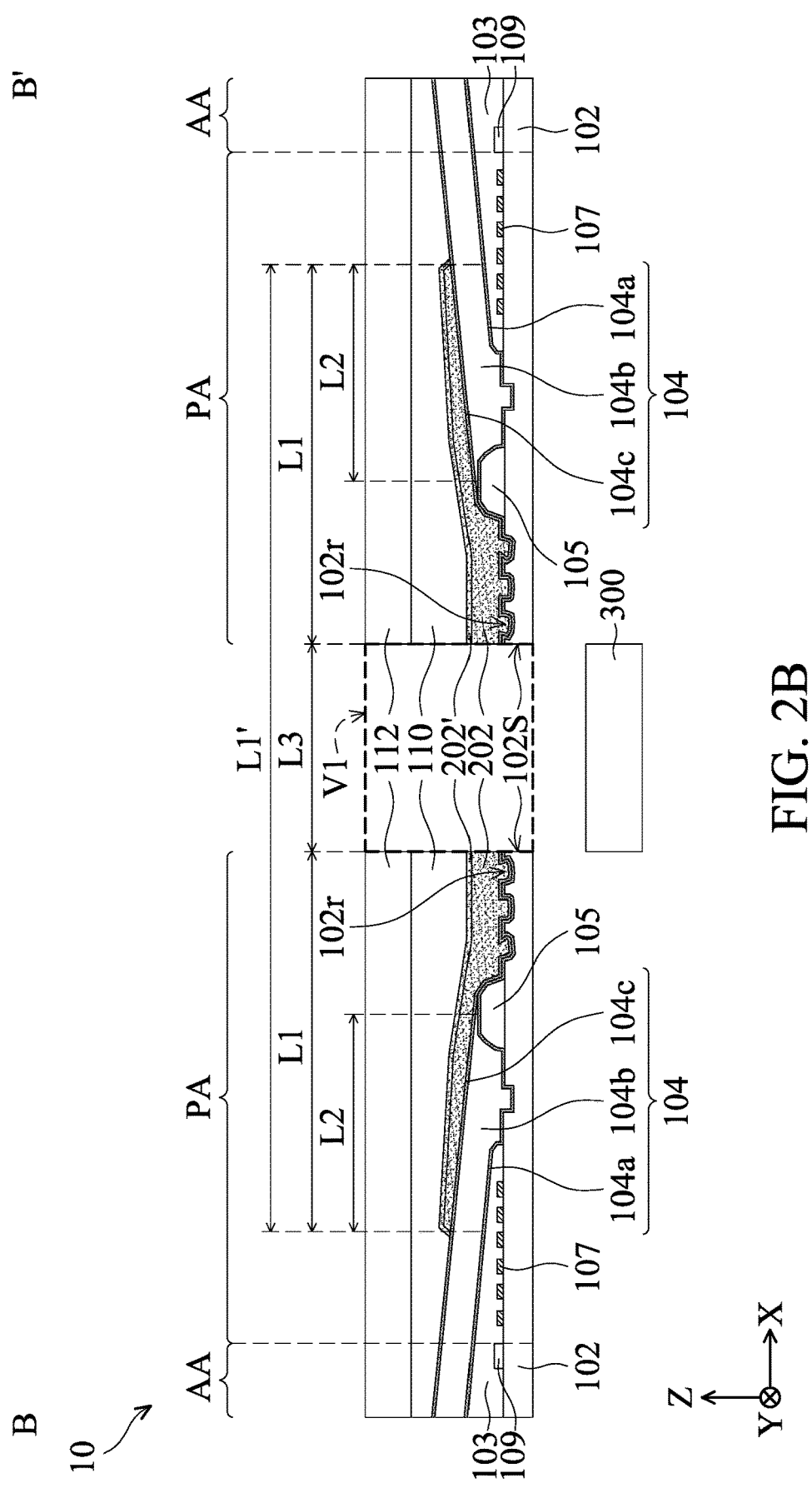
FIG. 2B is a partial cross-sectional diagram of an electronic device corresponding to the section line B-B' of FIG. 1A in accordance with some embodiments of the present disclosure.

Next, please refer to FIG. 1A, FIG. 1B and FIG. 2B. FIG. 2B is a partial cross-sectional diagram of the electronic device 10 corresponding to the section line B-B' of FIG. 1A in accordance with some embodiments of the present disclosure. The structure shown in FIG. 2B may correspond to the area around the through-hole V1 of the electronic device 10. It should be understood that, for clarity, some elements of the electronic device 10 are omitted in the drawings, and only some elements are schematically shown. Furthermore, in accordance with some embodiments, additional features may be added to the electronic device 10 described below.

As shown in FIG. 2B, in the cross-sectional view of the electronic device 10, the second insulating layer 202 has a length L1 in a direction perpendicular to the normal direction of the first insulating layer 102 (for example, the X direction in the drawing). In addition, the second insulating layer 202 has a first portion (not labeled) overlapping with the organic layer 104b, and the first portion has a length L2 in the aforementioned X direction. In accordance with some embodiments, a ratio of the length L2 of the first portion to the length L1 may be greater than or equal to 0.3 and less than or equal to 0.6 (i.e. $0.3 \le L2/L1 \le 0.6$). For example, the ratio of the length L2 to the length L1 may be 0.4 or 0.5, but it is not limited thereto. Specifically, in accordance with some embodiments, in a direction perpendicular to the normal direction of the first insulating layer 102 (for example, the X direction in the drawing), the length L2 of the first portion where the second insulating layer 202 overlaps with the organic layer 104b may be greater than or equal to 50 μm and less than or equal to 300 μm (i.e. 50 μm≤length L2≤300 μm), such as 100 μm, 150 μm, 200 μm or 250 μm, but it is not limited thereto.

It should be noted that when the ratio of the length L2 of the first portion to the length L1 is too small (for example, L2/L1<0.3) (that is, the overlapping portion of the second insulating layer 202 and the organic layer 104b is too small, or they do not overlap at all), the effect of the second insulating layer 202 on improving the surface flatness may be reduced. On the contrary, when the ratio of the length L2 of the first portion to the length L1 is too large (for example, L2/L1>0.6) (that is, the overlapping area of the second insulating layer 202 and the organic layer 104b is too large), the second insulating layer 202 may cover the electronic component 109 and affect the performance of the electronic component 109. For example, when the electronic component 109 is a light-emitting component, the second insulating layer 202 may cover the light-emitting layer of the light-emitting component to reduce the light transmittance.

As shown in FIG. 1A, FIG. 1B and FIG. 2B, the side surface 102S of the first insulating layer 120 is enclosed to form a through-hole V1. In addition, in the cross-sectional view of the electronic device 10, the through-hole V1 has a length L3 in a direction perpendicular to the normal direction of the first insulating layer 102 (for example, the X direction in the drawing). In accordance with some embodiments, the length L1 of the second insulating layer 202 and the length L3 satisfy the following relation: $1.05 \leq (2*L1+L3)/L3 \leq 1.5$. In accordance with some embodiments, twice the length L1 plus the length L3 can be regarded as a total length L1' of the second insulating layer 202. Specifically, in accordance with some embodiments, the total length L1' of the second insulating layer 202 may be between 1680 μm and 4500 μm (i.e. 1680 μm≤total length L1'≤4500 μm), such as 2000 μm, 2500 μm, 3000 μm, 3500 μm or 4000 μm, but it is not limited thereto. In accordance with some embodiments, the length L3 of the through-hole V1 may be between 1600 μm and 3000 μm (i.e. 1600 μm≤length L3≤3000 μm), such as 2000 μm or 2500 μm, but it is not limited thereto.

Furthermore, the aforementioned total length L1' refers to the total length of the second insulating layer 202 in a direction perpendicular to the normal direction of the first insulating layer 102 (for example, the X direction in the drawing). The total length L1' includes the length L3 of the through-hole V1, and it is also the distance between the two ends of the second insulating layer 202 farther away from the through-hole V1 in the X direction. Moreover, the total length L1' substantially passes through the center of the through-hole V1. Furthermore, the length L3 of the through-hole V1 refers to the length of the through-hole V1 passing through its center in a direction perpendicular to the normal direction of the first insulating layer 102 (for example, the X direction in the drawing). For example, in the top-view diagram, if the through-hole V1 is circular, the center of the through-hole V1 can be the center of the circle; if the through-hole V1 has a shape similar to rectangle or square shape, the center can be the intersection of two diagonals of the rectangle or square; if the through-hole V1 has an irregular shape and its center cannot be defined in the aforementioned manner, a minimum rectangle that can encompass the through-hole V1 can be drawn, and the intersection of the two diagonals of the minimum rectangle can be defined as the center of the through-hole V1, but the present disclosure is not limited thereto.

It should be noted that when the second insulating layer 202 has an appropriate length design, it has a better leveling effect on the area around the through-hole V1, and is easy to be bonded to the adhesive layer 110 later. Specifically, if the ratio of the total length L1' of the second insulating layer 202 to the length L3 of the through-hole V1 is too small (for example, $(2*L1+L3)/L3<1.05$), the leveling effect of the second insulating layer 202 may be reduced. On the contrary, if the ratio of the total length L1' of the second insulating layer 202 to the length L3 of the through-hole V1 is too large (for example, $(2*L1+L3)/L3>1.5$), the second insulating layer 202 may cover the electronic component 109 and affect the performance of the electronic component 109. For example, when the electronic component 109 is a light-emitting component, the second insulating layer 202 may cover the light-emitting layer of the light-emitting component and reduce the light transmittance.

In addition, as shown in FIG. 2B, in accordance with some embodiments, the electronic device 10 may further include an optical sensor 300, and the optical sensor 300 may be disposed corresponding to the through-hole V1. In other words, in the normal direction of the first insulating layer 102 (for example, the Z direction in the drawing), the optical sensor 300 may overlap with the through-hole V1. In accordance with some embodiments, the optical sensor 300 may include a camera, a fingerprint sensor, a proximity sensor, another suitable sensing element, or a combination thereof, but it is not limited thereto.

Figure 3:
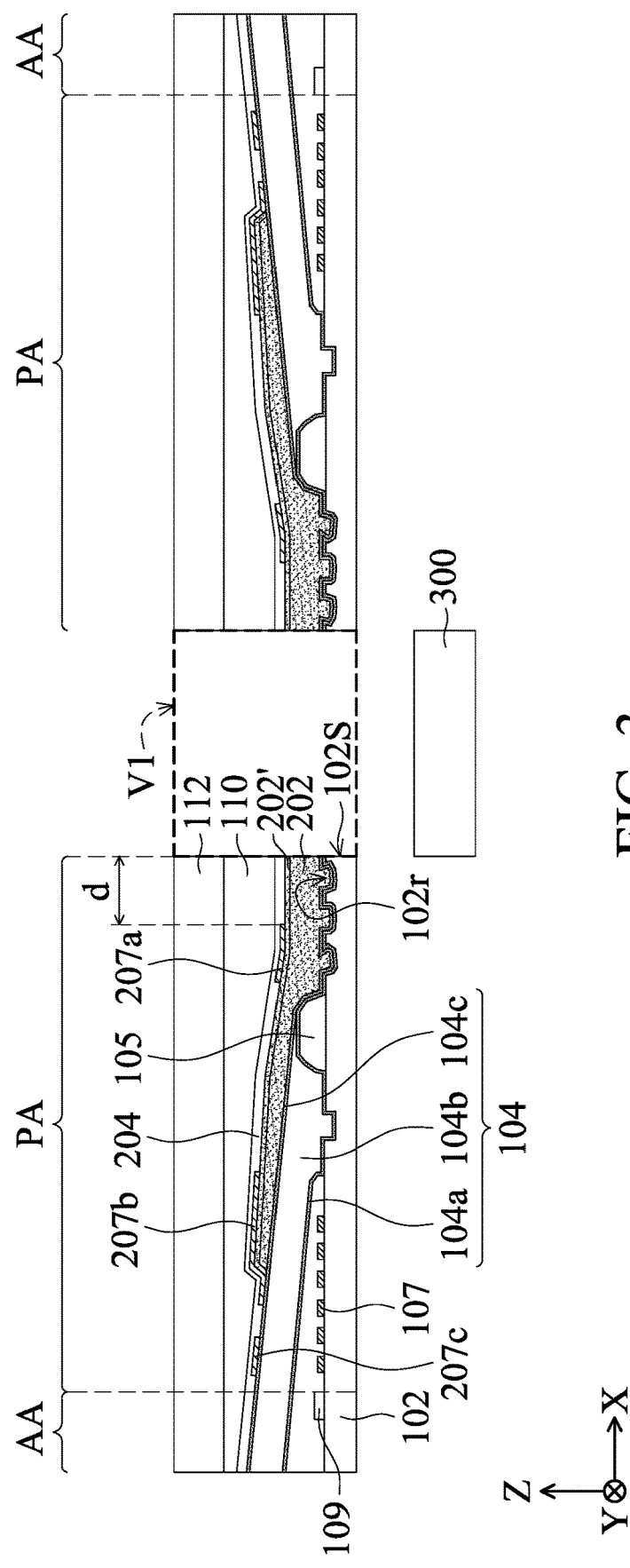
FIG. 3 is a partial cross-sectional diagram of an electronic device corresponding to the section line B-B' of FIG. 1A in accordance with some embodiments of the present disclosure.

Next, please refer to FIG. 3, which is a partial cross-sectional diagram of an electronic device 20 corresponding to the section line B-B' of FIG. 1A in accordance with some other embodiments of the present disclosure. It should be understood that that the same or similar components or elements in the following paragraphs will be denoted by the same or similar reference numbers, and their materials, manufacturing methods and functions are the same or similar to those described above, and thus they will not be repeated hereafter.

As shown in FIG. 3, the electronic device 20 may further include a third insulating layer 204. The third insulating layer 204 may be disposed on the second insulating layer 202 and the inorganic layer 202', and the third insulating layer 204 may also be disposed on the inorganic layer 104c of the insulating layer 104. Moreover, the third insulating layer 204 may be bonded to the adhesive layer 110, and the adhesive layer 110 can be bonded to the third insulating layer 204. In accordance with some embodiments, the material of the third insulating layer 204 may include an organic material or an inorganic material, and the organic material and inorganic material may be the same as or similar to that as mentioned above, and will not be repeated here.

It should be noted that since the third insulating layer 204 is disposed on the second insulating layer 202 and the inorganic layer 104c, the third insulating layer 204 can be bonded to the adhesive layer 110, and the third insulating layer 204 can provide relatively consistent surface properties. The overall adhesion uniformity between the third insulating layer 204 and the adhesive layer 110 therefore can be improved.

In addition, in accordance with some embodiments, the electronic device 20 may further include a circuit component 207a, a circuit component 207b, and a circuit component 207c disposed above the second insulating layer 202, but the present disclosure is not limited thereto. The circuit component 207a, the circuit component 207b, and the circuit component 207c may be, for example, metal wires that provide a touch sensing function, but they are not limited thereto. Since the circuit component 207a, the circuit component 207b and the circuit component 207c are disposed above the second insulating layer 202, the probability of the circuit components being disconnected due to the ups and downs of the first insulating layer 102 (for example, the recess 102r) can be reduced. The arrangement of the second insulating layer 202 can also increase the layout area of the circuit.

In accordance with some embodiments, in the normal direction of the first insulating layer 102 (for example, the Z direction in the drawing), the circuit component 207a may overlap with the recess 102r, the circuit component 207b may overlap with the circuit component 107 disposed on the first insulating layer 102, and the circuit component 207c may not overlap with the electronic component 109. In accordance with some embodiments, in a direction perpendicular to the normal direction of the first insulating layer 102 (for example, the X direction in the drawing), there is a distance d between the circuit component 207a and the through-hole V1, and the distance d may be between 5 µm and 100 µm (i.e. 5 µm≤distance d≤100 µm), or between 30 µm and 60 µm, such as 40 µm or 50 µm, but it is not limited thereto. Due to the distance d between the circuit component 207a and the through-hole V1, the risk of oxidation and/or corrosion of the circuit component can be reduced. Moreover, in accordance with some embodiments, the circuit component 207b may be conformally disposed on the inorganic layer 104c and the second insulating layer 202, or the circuit component 207b may be conformally disposed on the inorganic layer 104c and the inorganic layer 202'. The circuit component 207b may cross through the junction of the inorganic layer 104c and the second insulating layer 202 (or the inorganic layer 104c and the inorganic layer 202'), so it can also reduce the risk of separation of the inorganic layer 104c and the second insulating layer 202 (or the inorganic layer 104c and the inorganic layer 202'). As described above, since the circuit component 207c does not overlap with the electronic component 109, the effect on the performance of the electronic component 109 can be reduced. In addition, in some embodiments where the electronic component 109 is a light-emitting element (e.g., OLED), the position of the electronic component 109 refers to the area where the light-emitting element can emit light.

In accordance with some embodiments, the material of the circuit component 207a, the circuit component 207b, and the circuit component 207c can refer to the material of the circuit component 107 described above, and will not be repeated here.

Figure 4:
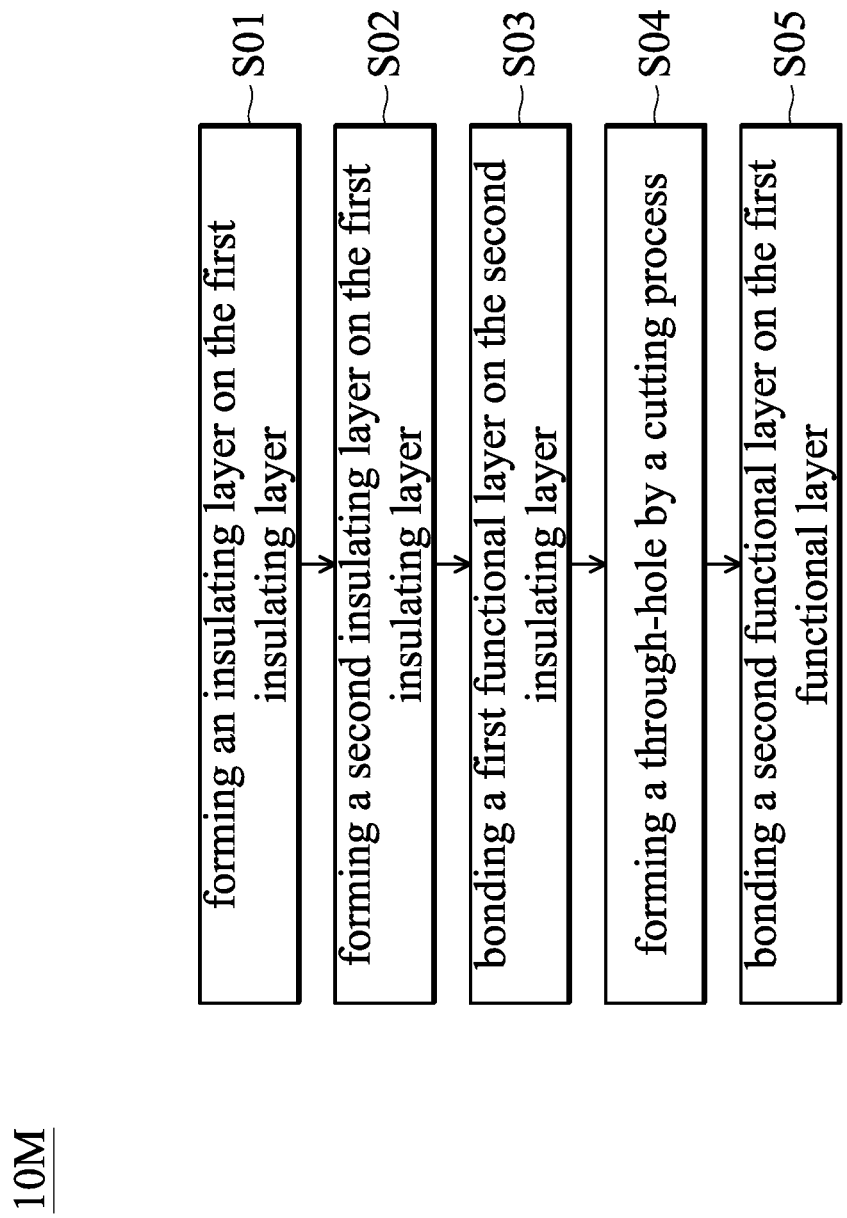
FIG. 4 is a flowchart of steps of a manufacturing method of an electronic device in accordance with some embodiments of the present disclosure.

Next, please refer to FIG. 4 and FIG. 5A to FIG. 5E. FIG. 4 is a flowchart of steps of a manufacturing method 10M of an electronic device in accordance with some embodiments of the present disclosure. FIG. 5A to FIG. 5E are schematic structural diagrams of an electronic device during the manufacturing process in accordance with some embodiments of the present disclosure. In accordance with some embodiments, the electronic device shown in FIG. 5A to FIG. 5E is formed by the manufacturing method 10M. It should be understood that, in accordance with some embodiments, additional operations may be provided before, during and/or after the manufacturing method 10M is performed. In accordance with some embodiments, some stages (or steps) described below may be replaced or omitted.

Figure 5A:
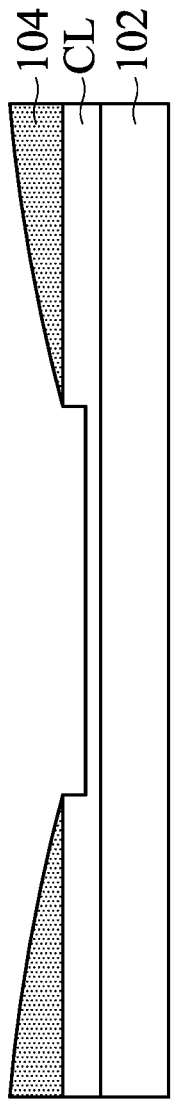

Please refer to FIG. 4 and FIG. 5A, the manufacturing method 10M of the electronic device may include a step S01, forming an insulating layer 104 on the first insulating layer 102. In accordance with some embodiments, before forming the insulating layer 104, the first insulating layer 102 is provided, and a circuit layer CL may be formed on the first insulating layer 102 first. In accordance with some embodiments, the circuit layer CL may include circuit components 107 and electronic components 109, etc., but it is not limited thereto.

In accordance with some embodiments, the insulating layer 104 may be formed by a chemical vapor deposition (CVD) process, a spin coating process, another suitable method, or a combination thereof. The chemical vapor deposition process may include, for example, a low pressure chemical vapor deposition (LPCVD) process, a low temperature chemical vapor deposition (LTCVD) process, a rapid thermal chemical vapor deposition (RTCVD) process, a plasma enhanced chemical vapor deposition (PECVD) process, an atomic layer deposition (ALD) process, etc., but it is not limited thereto. In accordance with some embodiments, the circuit layer CL may be formed by a chemical vapor deposition process, a spin coating process, a physical vapor deposition process, an electroplating process, an electroless plating process, another suitable method, or a combination thereof. Moreover, the insulating layer 104 and the circuit layer CL may be patterned by one or more photolithography processes and/or etching processes. In accordance with some embodiments, the photolithography process may include photoresist coating (e.g., spin coating), soft baking, hard baking, mask aligning, exposure, post-exposure baking, developing the photoresist, rinsing, drying, etc., but it is not limited thereto. The etching process may include a dry etching process or a wet etching process, but it is not limited thereto.

Figure 5B:
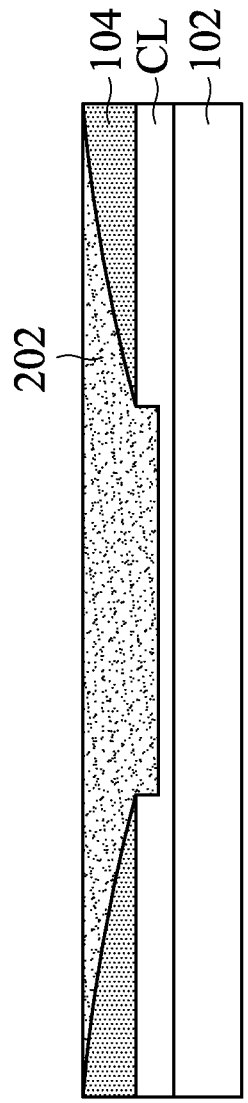

Next, please refer to FIG. 4 and FIG. 5B, the manufacturing method 10M of the electronic device may include a step S02, forming a second insulating layer 202 on the first insulating layer 102. Moreover, the second insulating layer 202 may be formed on the circuit layer CL and the insulating layer 104. In the normal direction of the first insulating layer 102 (for example, the Z direction in the drawing), a portion of the second insulating layer 202 may overlap with the insulating layer 104.

In accordance with some embodiments, the second insulating layer 202 may be formed by a chemical vapor deposition process, a spin coating process, another suitable method, or a combination thereof.

Figure 5C:
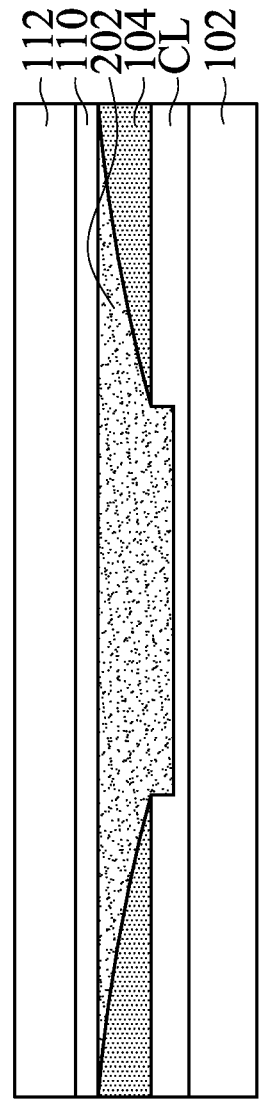

Next, please refer to FIG. 4 and FIG. 5C, the manufacturing method 10M of the electronic device may include a step S03, bonding a first functional layer 112 on the second insulating layer 202. Specifically, an adhesive layer 110 may be formed on the second insulating layer 202 first, and the first functional layer 112 and the second insulating layer 202 may be bonded through the adhesive layer 110. Alternatively, the adhesive layer 110 may be formed on the first functional layer 112 first, and the first functional layer 112 and the second insulating layer 202 may be bonded through the adhesive layer 110, but the present disclosure is not limited thereto.

Next, please refer to FIG. 4 and FIG. 5D, the manufacturing method 10M of the electronic device may include a step S04, forming a through-hole V1 by a cutting process CP. Specifically, portions of the first insulating layer 102, the circuit layer CL, the insulating layer 104, the second insulating layer 202 and the first functional layer 112 may be removed by the cutting process CP to form the through-hole V1 penetrating the above-mentioned elements.

In accordance with some embodiments, the cutting process CP may include a laser cutting process, but it is not limited thereto.

Next, referring to FIG. 4 and FIG. 5E, the manufacturing method 10M of the electronic device may include a step S05, bonding a second functional layer 212 on the first functional layer 112. The second functional layer 212 may be bonded to the first functional layer 112 through an adhesive layer (not shown). In the normal direction of the first insulating layer 102 (for example, the Z direction in the drawing), a portion of the second functional layer 212 may overlap with the through-hole V1. In accordance with some embodiments, the second functional layer 212 may include a scratch-resistant layer and may serve as a cover layer to protect elements disposed thereunder, including the optical sensor 300 (e.g., as shown in FIG. 2B).

In accordance with some embodiments, the material of the second functional layer 212 may include glass, quartz, sapphire, ceramic, polyimide (PI), polycarbonate (PC), polyethylene terephthalate (PET), polypropylene (PP), another suitable material or a combination thereof, but it is not limited thereto. Furthermore, the second functional layer 212 may have a single-layer structure or a multi-layer structure.

To summarize the above, according to the embodiments of the present disclosure, the electronic device provided includes an insulating layer structure configured in a specific way. For example, the second insulating layer is filled in the recess of the first insulating layer, the adhesive layer is covered on the second insulating layer, and the thickness of the adhesive layer is greater than the thickness of the second insulating layer. This configuration can reduce the problems of uneven thickness of the film layers or peeling of the film layers caused by the adsorption of water and oxygen in the edge area of the substrate or the area around the through-hole of the substrate. Therefore, the adhesion between the insulating layer structure and the upper functional layer can be improved, or the overall reliability of the electronic device can be improved.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps. In addition, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. An electronic device, comprising:
    a first insulating layer having a side surface and at least one recess adjacent to the side surface;
    a second insulating layer disposed on the first insulating layer and filled in the at least one recess;
    an adhesive layer disposed on the second insulating layer; and
    a functional layer disposed on the adhesive layer;
    wherein in a cross-sectional view of the electronic device, the second insulating layer has a thickness at a first position, and a thickness of the adhesive layer corresponding to the first position is greater than the thickness of the second insulating layer.
2. The electronic device as claimed in claim 1, wherein the second insulating layer has a maximum thickness at the first position.
3. The electronic device as claimed in claim 1, wherein a ratio of the thickness of the adhesive layer to the thickness of the second insulating layer is greater than 1 and less than or equal to 5.
4. The electronic device as claimed in claim 3, wherein the ratio is greater than or equal to 2 and less than or equal to 3.
5. The electronic device as claimed in claim 1, wherein in the cross-sectional view of the electronic device, the second insulating layer has a first end adjacent to the side surface and a second end away from the side surface, the first end has a first thickness and the second end has a second thickness, and a ratio of the second thickness to the first thickness is greater than or equal to 0.8 and less than or equal to 1.2.
6. The electronic device as claimed in claim 1, wherein in the cross-sectional view of the electronic device, the second insulating layer has a first end adjacent to the side surface and the first insulating layer has a third end adjacent to the side surface, the first end has a first thickness and the third end has a third thickness, and a ratio of the third thickness to the first thickness is greater than or equal to 0.8 and less than or equal to 1.2.
7. The electronic device as claimed in claim 1, further comprising:
    a protrusion structure disposed between the first insulating layer and the second insulating layer, wherein the protrusion structure is not overlapped with the at least one recess.
8. The electronic device as claimed in claim 7, wherein in the cross-sectional view of the electronic device, the second insulating layer has a first end adjacent to the side surface, the first end has a first thickness, the protrusion structure has a fourth thickness, and a ratio of the fourth thickness to the first thickness is greater than or equal to 0.8 and less than or equal to 1.2.
9. The electronic device as claimed in claim 7, wherein in the cross-sectional view of the electronic device, the second insulating layer has a first end adjacent to the side surface, the first end has a first thickness, the protrusion structure has a fourth thickness, the at least one recess has a first depth, and the first thickness is greater than the first depth and less than the fourth thickness.
10. The electronic device as claimed in claim 7, further comprising:
    an organic layer disposed between the first insulating layer and the second insulating layer, wherein the organic layer is overlapped with at least a portion of the protrusion structure and not overlapped with the at least one recess.
11. The electronic device as claimed in claim 10, wherein, in the cross-sectional view of the electronic device, the second insulating layer has a first length in a direction perpendicular to a normal direction of the first insulating layer, the second insulating layer has a first portion overlapping the organic layer, the first portion has a second length in the direction, and a ratio of the second length to the first length is greater than or equal to 0.3 and less than or equal to 0.6.
12. The electronic device as claimed in claim 10, wherein the second insulating layer has a first portion overlapping the organic layer, the first portion has a second length in a direction perpendicular to a normal direction of the first insulating layer, and the second length is greater than or equal to 50 micrometers and less than or equal to 300 micrometers.

13. The electronic device as claimed in claim 1, further comprising a first inorganic layer and a second inorganic layer, wherein the second insulating layer is disposed between the first inorganic layer and the second inorganic layer, and the second insulating layer comprises an organic material.

14. The electronic device as claimed in claim 1, wherein the side surface is enclosed to form a through-hole.

15. The electronic device as claimed in claim 14, wherein in the cross-sectional view of the electronic device, the second insulating layer has a first length L1 in a direction perpendicular to a normal direction of the first insulating layer, the through-hole has a third length L3 in the direction, and the first length L1 and the third length L3 satisfy the following relation:

$$1.05 \leq (2*L1+L3)/L3 \leq 1.5.$$

16. The electronic device as claimed in claim 14, further comprising an optical sensor disposed corresponding to the through-hole.

17. The electronic device as claimed in claim 1, which is a display device.

18. The electronic device as claimed in claim 17, wherein the functional layer comprises an anti-reflection layer.

19. The electronic device as claimed in claim 1, further comprising a third insulating layer disposed on the second insulating layer and bonded to the adhesive layer.

20. The electronic device as claimed in claim 14, further comprising a circuit component disposed above the second insulating layer, wherein there is a distance between the circuit component and the through-hole, and the distance is between 5 micrometers and 100 micrometers.

* * * * *